United States Patent [19]

Okumura

[11] Patent Number: 4,741,802

[45] Date of Patent: May 3, 1988

[54] METHOD FOR MANUFACTURING SEMICONDUCTOR DEVICE

[75] Inventor: Yoshinori Okumura, Hyogo, Japan

[73] Assignee: Mitsubishi Denki Kabushiki Kaisha, Tokyo, Japan

[21] Appl. No.: 55,143

[22] Filed: May 28, 1987

[30] Foreign Application Priority Data

May 28, 1986 [JP] Japan .................. 61-122714

[51] Int. Cl.$^4$ ................ H01L 21/306; B44C 1/22; C03C 15/00; C23F 1/02
[52] U.S. Cl. ................ 56/648; 156/653; 156/656; 156/657; 156/659.1; 156/662; 437/52; 437/61; 437/228; 437/233; 437/235
[58] Field of Search ............ 156/643, 646, 648, 653, 156/657, 659.1, 656, 662; 204/192.37; 357/23.6, 44, 47, 49, 55, 59, 67; 427/38, 39; 437/34, 52, 57, 61, 63, 64, 72, 78, 79, 228, 233, 235, 237

[56] References Cited

U.S. PATENT DOCUMENTS

4,477,310 10/1984 Park et al. .................. 156/643 X
4,645,564 2/1987 Morie et al. ................. 156/648 X

OTHER PUBLICATIONS

Nakajima, S. et al, "An Isolation-Merged Vertical Capacitor Cell for Large Capacity Dram", *International Electron Device Meeting*, 1984, (IEDM 84), pp. 240-243.

*Primary Examiner*—William A. Powell
*Attorney, Agent, or Firm*—Lowe, Price, LeBlanc, Becker & Shur

[57] ABSTRACT

A method for manufacturing a semiconductor device comprises the steps of forming a trench (2) on the major surface of a semiconductor substrate (1) and depositing a polysilicon film (5) on the entire surface of the semiconductor substrate (1) including the inside of said trench (2). In order to form complete isolation in the bottom portion of the trench (2), the trench (2) is filled with an oxide film (10). A refractory metal (12) such as tungsten which can be selectively deposited on polysilicon is deposited only on the polysilicon film (5) on the major surface of the semiconductor substrate (1). The oxide (10) inside the trench (2) removed and then, anisotropic etching of the polysilicon film (5) in the bottom portion of the trench (2) is performed utilizing the refractory metal (12) as a mask, so that isolation is formed in a self-aligning manner. thereafter, an oxide film (13) and a polysilicon film (14) are formed successively, so that three-dimensional charge storage capacitance is achieved.

6 Claims, 7 Drawing Sheets

METHOD FOR MANUFACTURING SEMICONDUCTOR DEVICE

BACKGROUND OF THE INVENTION

1. Field of the Invention

The present invention relates to a method for manufacturing a semiconductor device and more particularly, to a method for manufacturing a semiconductor device capable of forming isolation in the bottom portion of a trench formed on a semiconductor substrate in a self-aligning manner.

2. Description of the Prior Art

Conventionally, in a semiconductor device such as an MOS (Metal Oxide Semiconductor) dynamic memory, a trench has been formed in an isolation region of a semiconductor substrate and three-dimensional charge storage capacitance utilizing a polysilicon film as an electrode has been embedded in the trench to compensate for decrease in two-dimensional charge storage capacitance caused by high integration of a memory cell.

A three-dimensional capacitor cell for such a large capacity dynamic memory is disclosed in, for example, an article by S. Nakajima et al., entitled "AN ISOLATION-MERGED VERTICAL CAPACITOR CELL FOR LARGE CAPACITY DRAM", International Electron Device Meeting, 1984 (IEDM 84), pp. 240-243.

FIGS. 1A to 1F are cross sectional views showing each main process in a method for manufacturing the conventional semiconductor device. Referring now to the drawings, description is made on the conventional semiconductor device.

Referring now to FIG. 1A, a trench 2 is formed on the major surface of a semiconductor substrate 1 by anisotropic etching. An oxide film 3 formed by thermal oxidation is deposited over the major surface of the semiconductor substrate 1 and the entire surface inside the trench 2 and then, a direct contact 4 is formed by etching a part of the oxide film 3. Furthermore, a polysilicon film 5 including ions of a conductivity type opposite to that of the semiconductor substrate 1 is deposited on the oxide film 3 and then, a diffusion layer 6 including ions of the conductivity type opposite to that of the semiconductor substrate 1 is formed in the semiconductor substrate 1 through the direct contact 4.

Referring now to FIG. 1B, a resist 7 is applied on the entire surface of the polysilicon film 5 including the inside of the trench 2.

Referring now to FIG. 1C, patterning is applied by exposure and development so that the resist 7 may be removed from the inside of the trench 2 and resist 7 may be left only on the planar portion of the semiconductor substrate 1.

Referring now to FIG. 1D, the polysilicon film 5 exposed in the bottom portion of the trench 2 is removed by anisotropic etching utilizing the resist 7 left in the planar portion of the semiconductor substrate 1 as a mask, so that the polysilicon film 5 is divided into two in the bottom portion of the trench 2.

Referring now to FIG. 1E, the resist 7 is removed from the planar portion of the semiconductor substrate 1.

Referring now to FIG. 1F, a thin oxide film 8 is formed by oxidizing the polysilicon film 5 and then, a polysilicon film 9 is deposited thereon. Thus, charge storage capacitance is formed between the polysilicon films 5 and 9.

As described in the foregoing, in the conventional method for manufacturing the semiconductor device, a trench is formed in an isolation region of the semiconductor substrate and three-dimensional charge storage capacitance is formed on the side wall of the trench, so that large charge storage capacitance can be maintained as a whole, although two-dimensional charge storage capacitance is decreased due to decrease in the area of each memory cell caused by high integration. In addition, in the semiconductor device (FIG. 1F) manufactured by the above described method, the charge storage capacitance, i.e. charges stored in the polysilicon film 5 is affected by electrons of electron hole pairs formed in the semiconductor substrate 1 along the range of alpha particles only through the direct contact 4. Therefore, charge collection efficiency of the polysilicon film 5 is low, so that a semiconductor device having a structure immune to soft errors can be obtained.

However, since the conventional semiconductor device is manufactured by the above described method, the resist 7 embedded inside the trench 2 is thicker than the resist 7 formed on the planar portion of the semiconductor substrate 1 as shown in FIG. 1B, so that the resist 7 is liable to be left without being removed from the inside of a trench 2 by exposure and development. When such offset of a resist mask occurs, the polysilicon film 5 in the bottom portion of the trench 2 can not be removed by anisotropic etching, so that it is very difficult to divide the polysilicon film 5 into two to form complete isolation.

SUMMARY OF THE INVENTION

Briefly stated, the present invention provides a method for manufacturing a semiconductor device comprising the steps of preparing a semiconductor substrate, forming a trench on the surface of the semiconductor substrate, forming a polysilicon film on the surface of the semiconductor substrate and the entire surface inside the trench, filling the trench with oxide, forming a mask for etching only on the polysilicon film formed on the surface of the semiconductor substrate in a self-aligning manner using a material which selectively deposited on the polysilicon film or selectively removed from the oxide, removing the oxide inside the trench, and dividing the polysilicon film formed in the bottom portion of the trench using the mask for etching.

Therefore, a primary object of the present invention is to provide a method for manufacturing a semiconductor device capable of forming complete isolation in the bottom portion of the trench of the semiconductor substrate while maintaining conventional high integration and large charge storage capacitance.

A principal advantage of the present invention is that since a mask for dividing the polysilicon film in the bottom portion of the trench of the semiconductor substrate is formed in a self-aligning manner using a material which can be selectively deposited or selectively removed, offset of the mask does not occur unlike conventional patterning of a resist mask by exposure and development and isolation can be formed in the bottom portion of the trench in a self-aligning manner.

Another advantage of the present invention is that isolation having a distance shorter than the minimum size capable of patterning by exposure and development can be stably formed by a process.

Still another advantage of the present invention is that conventional high integration and large charge storage capacitance and a function for preventing occurrence of soft errors can be maintained.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1A:
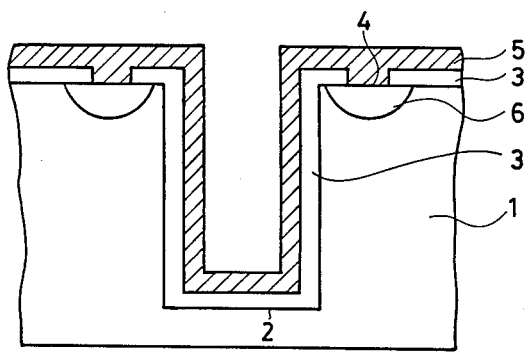
FIGS. 1A to 1F are cross sectional views showing each main process in a method for manufacturing a conventional semiconductor device.
Figure 1B:
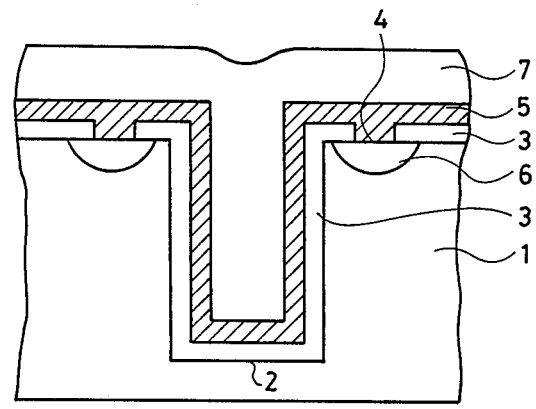
Figure 1C:
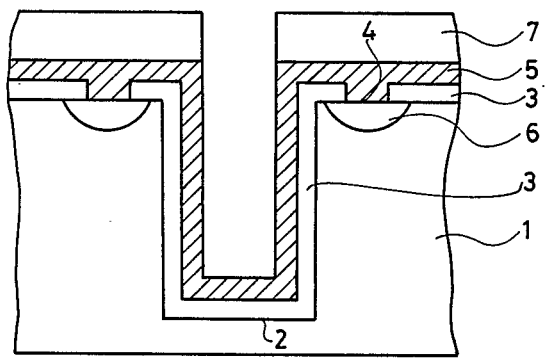
Figure 1D:
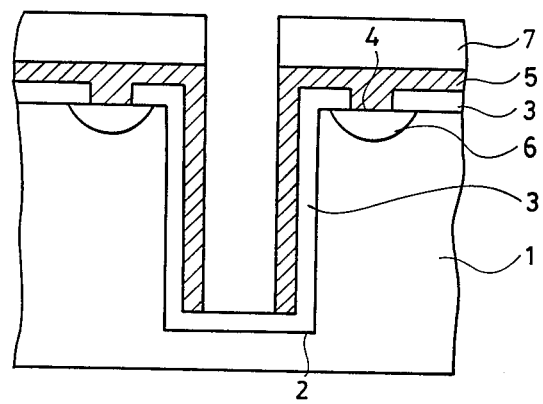
Figure 1E:
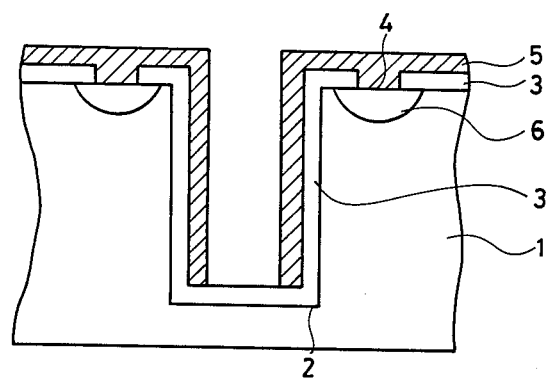
Figure 1F:
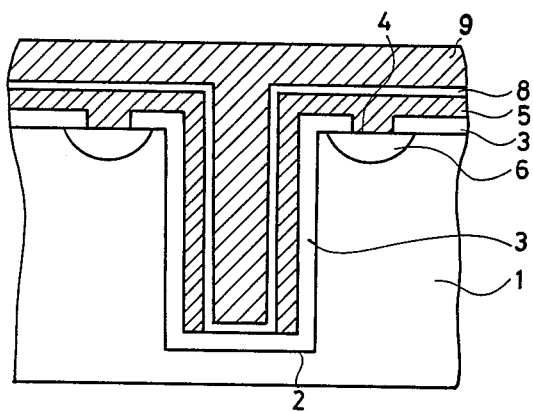

FIGS. 2A to 2H are cross sectional views showing each main process in a method for manufacturing a semiconductor device according to an embodiment of the present invention.

Referring now to the drawings, description is made on an embodiment of the present invention.

Figure 2A:
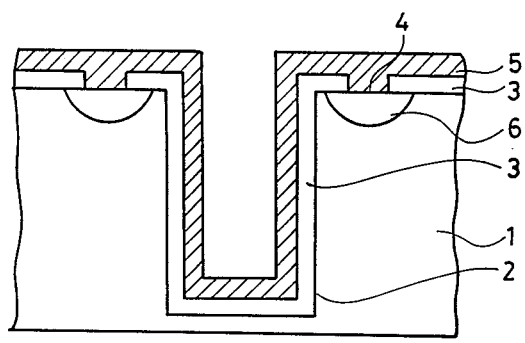
FIGS. 2A to 2H are cross sectional views showing each main process in a method for manufacturing a semiconductor device according to an embodiment of the present invention.

Referring now to FIG. 2A, a trench 2 is formed on the major surface of a semiconductor substrate 1 by anisotropic etching of the semiconductor substrate 1. An oxide film 3 formed by thermal oxidation is deposited on the major surface of the semiconductor substrate 1 and the entire surface inside the trench 2 and then, a direct contact 4 is formed by etching a part of the oxide film 3. Furthermore, a polysilicon film 5 including ions of a conductivity type opposite to that of the semiconductor substrate 1 is deposited on the oxide film 3 and then, a diffusion layer 6 including ions of the conductivity type opposite to that of the semiconductor substrate 1 is formed in the semiconductor substrate 1 through the direct contact 4.

Figure 2B:
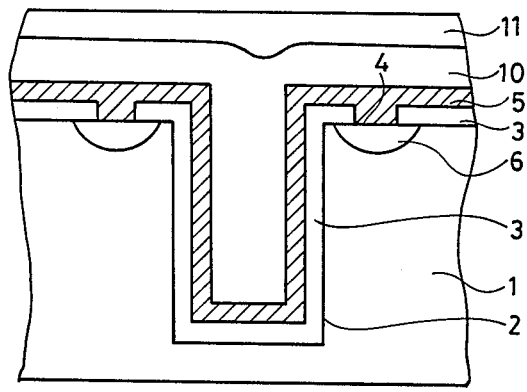

Referring now to FIG. 2B, an oxide film 10 formed by thermal oxidation is deposited on the entire surface of the polysilicon film 5 including the inside of the trench 2 and then, a resist 11 is applied thereon. The resist 11 is baked so that the surface thereof is flattened.

Figure 2C:
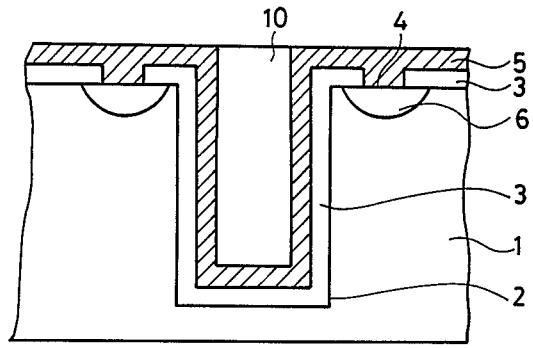

Referring now to FIG. 2C, simultaneous etch back of the oxide film 10 formed by thermal oxidation and the resist 11 is performed, so that the oxide film 10 formed by thermal oxidation is left only inside the trench 2, while the polysilicon film 5 is exposed in the other planar portion.

Figure 2D:
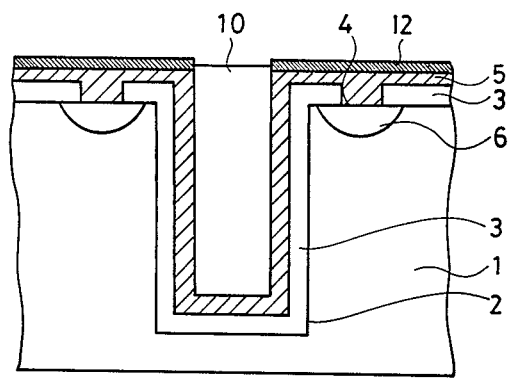

Referring now to FIG. 2D, a refractory metal 12 such as tungsten (W) which can be selectively deposited on polysilicon is selectively deposited on the polysilicon film 5.

Figure 2E:
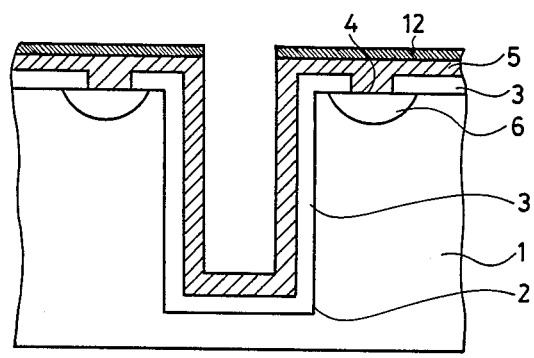

Referring now to FIG. 2E, the oxide film 10 formed by thermal oxidation which is left inside the trench 2 is removed.

Figure 2F:
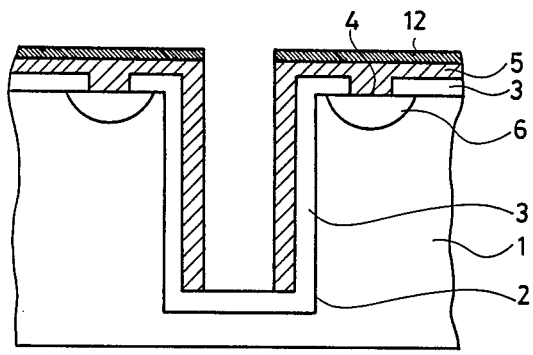

Referring now to FIG. 2F, anisotropic etching of the polysilicon film 5 exposed in the bottom portion of the trench 2 is performed utilizing the refractory metal 12 selectively deposited only on the polysilicon film 5 in the planar portion of the semiconductor substrate 1 as a mask. As a result, the polysilicon film 5 is divided into two in the bottom portion of the trench 2, so that isolation is formed in a self-aligning manner.

Figure 2G:
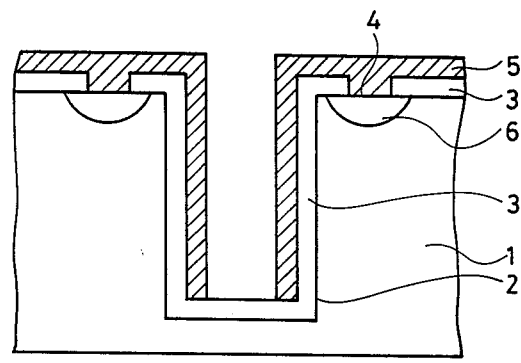

Referring now to FIG. 2G, the refractory metal 12 such as W (tungsten) is removed.

Figure 2H:
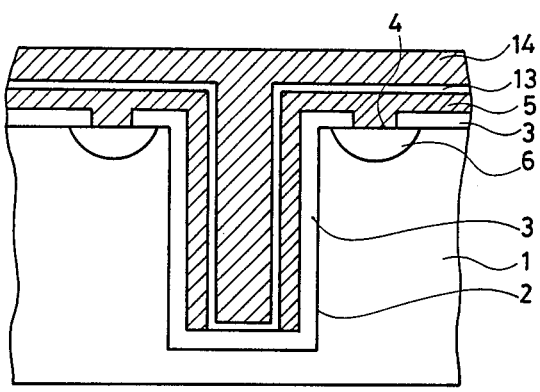

Referring now to FIG. 2H, a thin oxide film 13 is formed by oxidizing the polysilicon film 5 and then, a polysilicon film 14 is deposited thereon. As a result, charge storage capacitance utilizing the polysilicon films 5 and 14 as electrodes are formed.

Therefore, since a mask for anisotropic etching of polysilicon in the bottom portion of a trench can be formed in a self-aligning manner by selectively depositing a refractory metal, such as W, only on a polysilicon film formed in the planar portion of a semiconductor substrate, offset of the mask does not occur unlike conventional patterning of a resist mask by exposure and development. In addition, since the deposition process of the refractory metal such as W is a process at atom level, isolation having a distance shorter than the minimum size capable of patterning by exposure and development can be stably formed by a process.

FIGS. 3A to 3F are cross sectional views showing each main process in a method for manufacturing the semiconductor device according to another embodiment of the present invention.

Referring now to the drawings, description is made on another embodiment of the present invention.

Figure 3A:
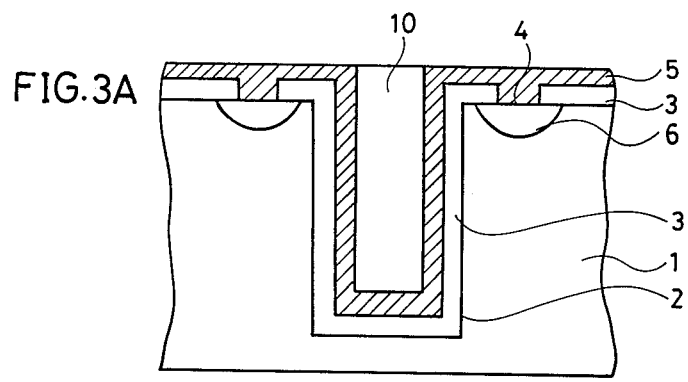
FIGS. 3A to 3F are cross sectional views showing each main process in a method for manufacturing a semiconductor device according to another embodiment of the present invention.

A process shown in FIG. 3A corresponds to the process shown in FIG. 2C in the first embodiment as described above. The state shown in FIG. 3A is obtained by the processes described referring to FIGS. 2A and 2B and therefore, the description thereof is omitted.

Figure 3B:
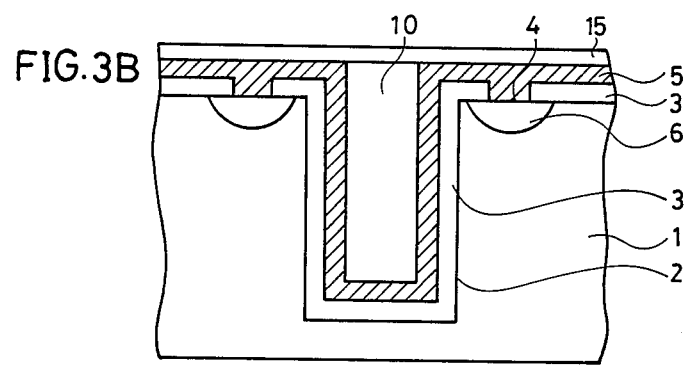

Referring now to FIG. 3B, a refractory metal 15 such as titanium (Ti) is deposited on the entire exposed surface of the polysilicon film 5 and the oxide film 10 formed by thermal oxidation.

Figure 3C:
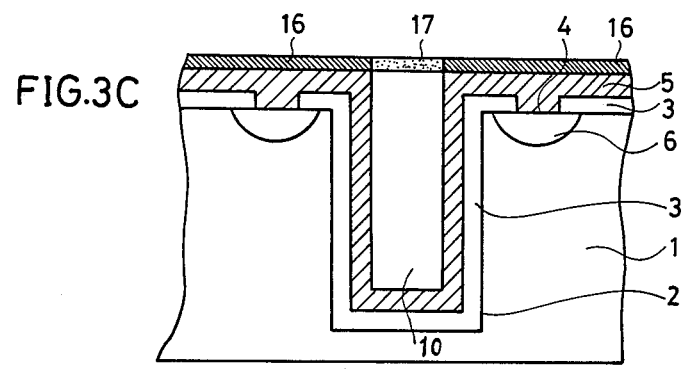

Referring now to FIG. 3C, the semiconductor substrate shown in FIG. 3B is annealed in an atmosphere of nitrogen. As a result, the refractory metal 15 such as Ti deposited on the polysilicon film 5 is made to be a refractory metal silicide 16 such as $TiSi_2$, while the refractory metal 15 such as Ti deposited on the oxide film 10 formed by thermal oxidation becomes a refractory metal nitride 17 such as TiN, which can be selectively removed from the oxide film.

Figure 3D:
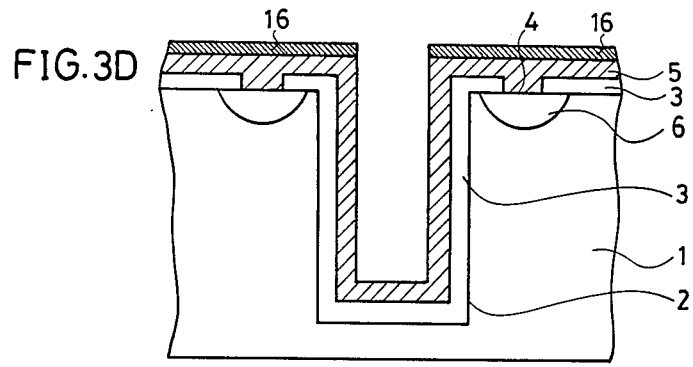

Referring now to FIG. 3D, only the above described refractory metal nitride 17 such as TiN is selectively removed, so that the refractory metal silicide 16 such as $TiSi_2$ is left only on the polysilicon film 5. Thereafter, the oxide film 10 formed by thermal oxidation is removed from the inside of the trench 2.

Figure 3E:
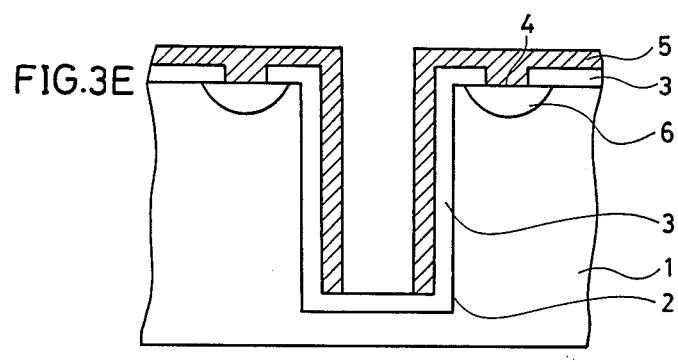

Referring now to FIG. 3E, anisotropic etching of the polysilicon film 5 exposed in the bottom portion of the trench 2 is performed utilizing as a mask the refractory metal silicide 16 selectively left only on the polysilicon film 5 in the planar portion of the semiconductor substrate 1. As a result, the polysilicon film 5 is divided into two in the bottom portion of the trench 2, so that isolation is performed in a self-aligning manner. Thereafter, the refractory metal silicide 16 such as $TiSi_2$ is removed.

Figure 3F:
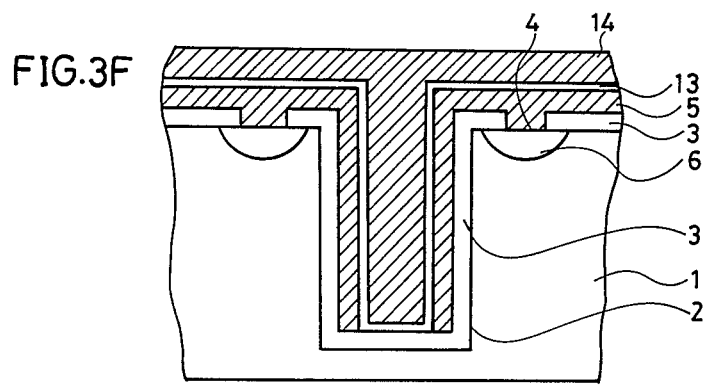

Referring now to FIG. 3F, the thin oxide film 13 is formed by oxidizing the polysilicon film 5 and then, the polysilicon film 14 is deposited thereon. Thus, charge storage capacitance utilizing the polysilicon films 5 and 14 as electrodes is formed.

As described in the foregoing, a mask for anisotropic etching of polysilicon in the bottom portion of a trench can be formed in a self-aligning manner by selectively removing a nitride of refractory metal such as Ti from an oxide film, in which case the same effect as that of the above described first embodiment can be obtained.

Although in the above described embodiment, a refractory metal such as W and Ti is utilized as a material of a mask for anisotropic etching of a polysilicon film, a material which can be selectively deposited on polysilicon or selectively removed from an oxide film and can be utilized as a mask for anisotropic etching may be used.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method for manufacturing a semiconductor device comprising the steps of:
   preparing a semiconductor substrate,
   forming a trench on the surface of said semiconductor substrate,
   forming a polysilicon film on the surface of said semiconductor substrate and the entire surface inside said trench,
   filling said trench with oxide,
   forming a mask for etching on said polysilicon film formed on the surface of said semiconductor substrate in a self-aligning manner using a material which can be selectively deposited on the polysilicon film or selectively removed from the oxide,
   removing said oxide inside said trench, and
   dividing said polysilicon film formed in the bottom portion of said trench utilizing said mask for etching.

2. A method for manufacturing a semiconductor device in accordance with claim 1, wherein
   said material which can be selectively deposited comprises a refractory metal.

3. A method for manufacturing a semiconductor device in accordance with claim 2, wherein
   said refractory metal comprises tungsten (W).

4. A method for manufacturing a semiconductor device in accordance with claim 1, wherein
   said step for forming said mask in a self-aligning manner using said material which can be selectively removed from said oxide comprises the steps of:
   depositing the refractory metal on said polysilicon film and said oxide,
   forming a refractory metal silicide on said polysilicon film and a refractory metal nitride on said oxide by annealing said deposited refractory metal in an atmosphere of nitrogen, and
   selectively removing only said refractory metal nitride formed on said oxide.

5. A method for manufacturing a semiconductor device in accordance with claim 4, wherein
   said refractory metal comprises titanium (Ti).

6. A method for manufacturing a semiconductor device in accordance with claim 1, wherein
   said step for dividing said polysilicon film formed in the bottom portion of said trench comprises a step of
   performing anisotropic etching of said polysilicon film.

* * * * *